United States Patent

Herchen et al.

[11] Patent Number: 5,819,434
[45] Date of Patent: Oct. 13, 1998

[54] ETCH ENHANCEMENT USING AN IMPROVED GAS DISTRIBUTION PLATE

[75] Inventors: Harald Herchen, Fremont; Walter Merry, Cupertino; William Brown, San Jose, all of Calif.

[73] Assignee: Applied Materials, Inc., Santa Clara, Calif.

[21] Appl. No.: 638,884

[22] Filed: Apr. 25, 1996

[51] Int. Cl.$^6$ ...................................................... F26B 19/00
[52] U.S. Cl. .................................. 34/232; 34/92; 34/229; 34/235; 156/345
[58] Field of Search ................................. 34/92, 229, 233, 34/235, 239, 60, 15, 17, 10, 232; 156/345

[56] References Cited

U.S. PATENT DOCUMENTS 5,177,878   1/1993   Visser .......................................... 34/92

*Primary Examiner*—Laurie Scheiner
*Attorney, Agent, or Firm*—Michael A. Glenn

[57] ABSTRACT

A thin gas distribution plate is provided, consistent with requirements for mechanical rigidity and strength. The gas distribution plate has sufficiently low mass to permit rapid heating to an equilibrium temperature as determined by radiated heat loss. The gas distribution plate has a thinner central cross-section, optionally including smaller diameter apertures formed therethrough; and has a thicker circumferential cross-section, optionally having larger apertures formed therethrough, to thereby promote even gas distribution across the surface of the wafer, while mitigating or eliminating entirely the first wafer effect.

18 Claims, 3 Drawing Sheets

ETCH ENHANCEMENT USING AN IMPROVED GAS DISTRIBUTION PLATE

BACKGROUND OF THE INVENTION

1. Technical Field

The invention relates to plasma processing and plasma processing equipment. More particularly, the invention relates to a plasma processing system that includes an improved gas distribution plate.

2. Description of the Prior Art

Plasma processing is an essential tool of the semiconductor manufacturing industry. Such processing uses electromagnetic radiation to dissociate the molecules of a reactive species and thereby produce a plasma. The plasma is used in a vacuum in a process environment and is typically directed through a gas distribution plate ("GDP") to the surface of a workpiece, such as a semiconductor wafer.

The main purpose of the GDP is to distribute the gas evenly over the wafer in such a way as to produce a uniform wafer etch or deposition. GDP hole sizes and distribution patterns are experimentally determined and varied to obtain the correct process gas distribution for each particular application.

Unfortunately, despite the provision of an even gas distribution pattern, such etch processes are subject to a deficiency known as the first wafer effect. The first-wafer effect occurs where a first wafer is etched at a different rate than that of subsequently processed wafers. Despite maintaining the same pressure, temperature, and plasma flow rate when processing a next wafer, the observed etch rate for such next and subsequent wafers differs from that of the first wafer. The etch rates may be either higher or lower for the subsequent wafers, depending upon the direction of the first wafer effect. Etch rates for such subsequent wafers thus tend to vary until a steady state level is reached within the process environment. Typically, a stable rate is achieved after from one to five wafers have been processed.

FIG. 1 is a graph showing the first-wafer effect for wafers etched using conventional etch equipment. Each wafer was etched for 75 seconds. The etch rate for the first wafer (1) is approximately 2050 Å/minute. The etch rate rises to approximately 2150 Å/minute for the second wafer (2) and stabilizes at approximately 2200 Å/minute for the etch of the third through tenth wafers (3 to 10).

The first-wafer effect is discussed in L. Loewenstein, J. Stefani, S. Watts Butler, First-wafer effect in remote plasma processing: The stripping of photoresist, silicon nitride and polysilicon, J. Vac. Sci. Technol. B 12(4), July/August 1994. In the article, the authors hypothesize that the cause of the first-wafer effect is the generation of species in a discharge that occurs during the first few seconds of system operation. These species are thought to coat the inside of the chamber, thereby altering the reactivity of the chamber walls. The resulting change in the process chemistry is said to affect the subsequent production of active species in the chamber.

However, based upon the inventor's experimentation, it appears that the first-wafer effect is most likely caused primarily by temperature effects within the chamber itself. In particular, the temperature of the GDP appears to be the primary causative factor of first wafer effect. It is thought by the inventors herein that the principal underlying the first-wafer effect is that, between the processing of consecutive wafers, the temperatures of the chamber components exposed to the process gas do not return to their original value, i.e. to their temperature prior to the introduction of the first wafer. Thus, in the prior art, chamber components, such as the chamber liner, the electrostatic chuck, and the lid, have been thermally bonded or connected to heat exchangers whose temperature varies by less than a few degrees. The GDP, however, is the one remaining component in current systems configurations that does not include some form of thermal mediation.

One method for causing the temperature of the chamber components return to their initial state between wafers is to cool the components actively. It is well known in the prior art to circulate a cooling fluid through a component to mediate its temperature. However, while such thermal mediation technique is suitable for use with various chamber components, such as the chamber wall and lid, it is very difficult to provide such active thermal mediation for a GDP because the GDP is located fully within the chamber and has very delicate features, in particular, the several holes formed therethrough.

If the GDP heats up to its equilibrium value in a time that is relatively short compared to the wafer process time, it returns to its original value in a similarly short time. One way to heat the GDP up to its equilibrium level is to provide a GDP that has a low thermal mass. A low thermal mass may be achieved in several ways. One way is to form the GDP of a low heat capacity material. However, the chemical processes in the chamber typically restrict the available materials to a few refractory materials that are highly resistant to the corrosive environment in which the GDP must function. Another way to reduce the thermal mass of the GDP is to reduce the actual mass, or the bulk, of the material that comprises the GDP.

As discussed above, an even flow of process gas over the wafer is desired to provide a uniform etch rate. The flow of process gas through a GDP and over a wafer surface tends to be faster in the center region of the wafer than at the circumference of the wafer. It is well known in the prior art to adjust the size, spacing, and number of holes in the GDP to compensate for the irregular distribution of process gas over the wafer. Thus, the profile of the holes is typically adjusted according to the requirements of the particular etch process.

In the prior art, GDP's are fabricated with sufficient strength and rigidity that they may be handled without incurring any damage. While a GDP may be made thinner, such that it does not have as much weight to support and, therefore, does not need to be as strong as a heavier GDP, stresses that occur during pump down and GDP rigidity during handling become more important factors in GDP design.

Furthermore, according to one prior art theory, a thicker GDP stores more heat, and thus may provide better thermal stability after the first few wafers are processed. Additionally a thicker, heavier GDP may provide better thermal contact to the chamber wall which it abuts because the chamber walls are a thermal sink, and the force of a heavy GDP abutting the chamber walls improves thermal contact therebetween, such that the heat may is more efficiently removed from the chamber.

A typical GDP, such as provides a center-fast arrangement, has very large holes along the edge. These large holes actually reduce the thermal transfer from the center of the GDP to the GDP edge because only a few thin members (i.e. those portions of the GDP that define the holes) are available for transferring the heat. The amount of thermal transfer from the GDP edge to the chamber wall is therefore minimal.

A more effective approach to remove the heat from the GDP between the processing of individual wafers is to raise the temperature of the GDP sufficiently to allow the heat to be removed from the GDP by radiation, as opposed to conduction. However, a thicker GDP typically cannot get hot enough during typical process times to allow a significant amount of heat radiation to occur.

Thus, a new technique is needed to mitigate the thermal inconsistencies of the prior art gas distribution plates. It would therefore be advantageous to provide a GDP having a low actual mass in which the time to reach an equilibrium temperature is reduced. It would be a further advantage if such a gas distribution plate were resistant to the process environment and significantly reduced, if not entirely eliminated, the first-wafer effect. It would be yet a further advantage if the GDP were capable of being profiled to promote even distribution of process gas over the surface of the wafer.

SUMMARY OF THE INVENTION

The invention provides an improved GDP that is very thin yet consistent with requirements for mechanical rigidity and strength. The GDP has sufficiently low mass to permit rapid heating to an equilibrium temperature, as determined by radiated heat loss. The GDP is profiled to provide even gas distribution over the surface of the wafer. A thin central portion reduces GDP mass to permit rapid heating of the GDP to an equilibrium temperature. The thin central portion of the GDP may have smaller holes that compensate for center-fast process gas flow, where the holes increase in number and size approaching the thicker circumference of the GDP to increase the flow of process gas at the wafer's edge.

DETAILED DESCRIPTION OF THE INVENTION

The preferred embodiment of the invention provides an improved gas distribution plate ("GDP") that is very thin at least in a center portion thereof, yet consistent with requirements for mechanical rigidity and strength. The first wafer effect provides that, until the temperature within the chamber stabilizes during the sequential processing of the cassette of wafers, there is some variance in etch rate from wafer to wafer. The invention helps maintain the GDP at a consistent temperature for each wafer processed in the chamber, thereby mitigating or eliminating the first wafer effect.

Figure 2:
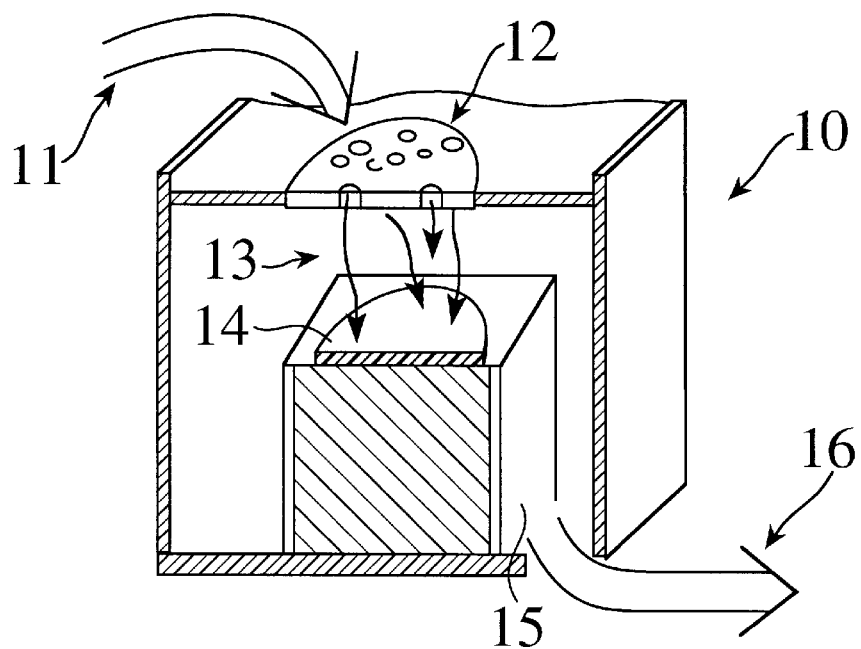
FIG. 2 is a partially sectioned, perspective schematic view of a typical process chamber showing a gas distribution plate.

FIG. 2 is a partially sectioned, perspective schematic view of a typical process chamber 10 showing a GDP 12. A process gas 11 is introduced into the chamber via the GDP and distributed in a pattern, shown by the arrow 13, across the surface of a wafer 14, which typically rests upon a wafer chuck 15. The spent processing gas and process borne residues 16 are exhausted from the chamber, and a next wafer may then be processed. During wafer processing, the vacuum chamber is initially pumped down and a cassette of wafers is loaded, one wafer at a time, into a load lock associated with the chamber using a robot (not shown). Each wafer 14 is etched and then removed and the next wafer loaded into the chamber. The vacuum in the chamber is maintained during the entire sequence of wafer processing.

After the chamber is pumped down from atmosphere, it is usually maintained under a vacuum for a period of up to several hours to remove any residual gases and water vapor. Such time is long enough for any chamber component temperatures to reach an equilibrium. However, when the temperatures are disturbed by some energy source during wafer processing there is a potential for a first wafer effect, especially in the case when the temperature of the components has not regained equilibrium after approximately one hour.

Figure 1:
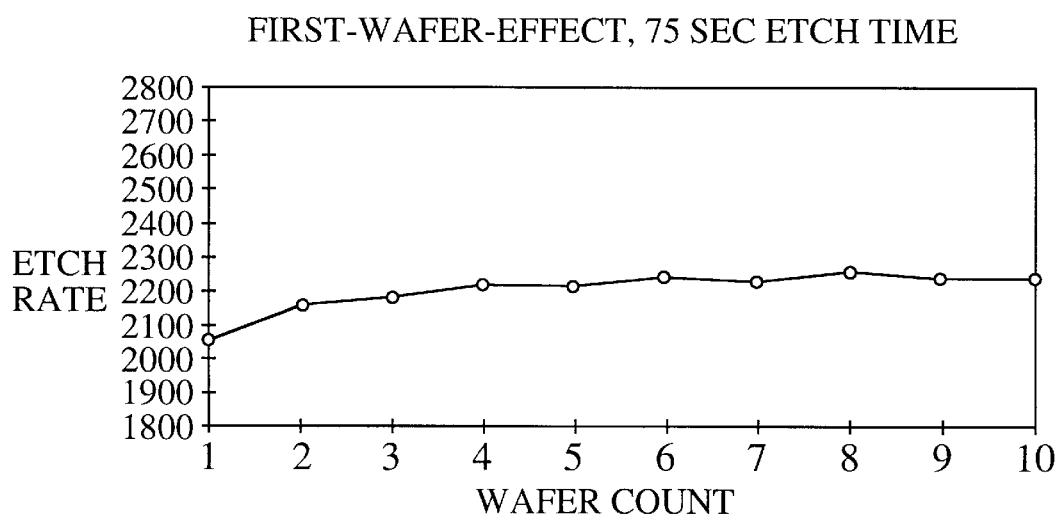
FIG. 1 is a graph illustrating the first-wafer effect according to the prior art.
Figure 3:
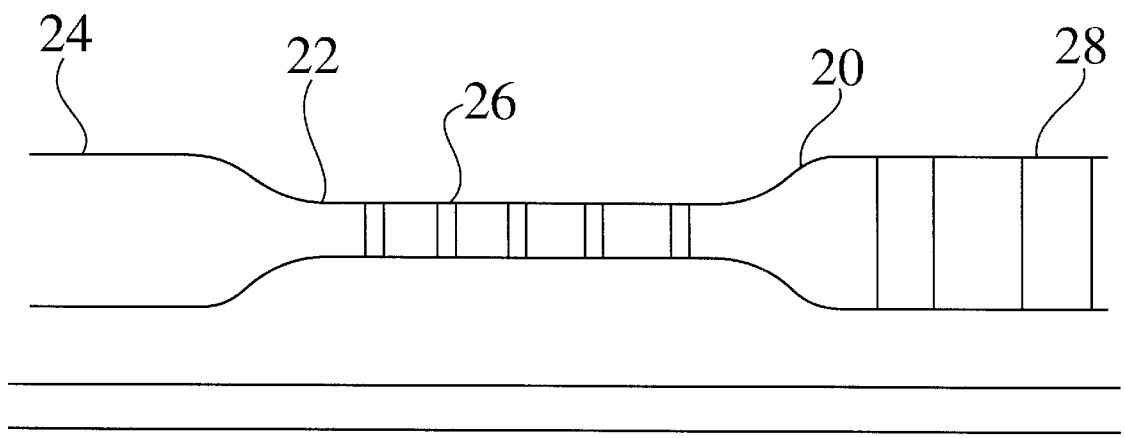
FIG. 3 is a side sectional view of a gas distribution plate according to a first embodiment of the invention.

FIG. 3 is a side sectional view of the gas distribution plate, according to the invention. The GDP 20 has a very thin central cross-section 22, and a thicker circumferential cross-section 24. In the preferred embodiment of the invention, the central portion of the GDP has a thickness of approximately $50/1000$'s of an inch or less. However, it is readily apparent to one skilled in the art that the thickness of the GDP may be varied according to the particular requirements of the process in which the GDP is used.

By providing a thin central portion when fabricating the GDP, the mass of the GDP is so low that the GDP heats up to an equilibrium temperature in a matter of a few seconds. Radiated heat transfer causes the major component of the GDP heat loss during an etch operation. A thin GDP thus heats up quickly to an equilibrium temperature, where the equilibrium is determined largely by the radiated heat loss, rather than by conduction or convection.

A GDP is typically profiled to compensate for center-fast flow. Center-fast flow refers to the phenomenon that there is typically a faster etch rate at the center of the wafer than at the edges of the wafer. To reduce this faster etching at the wafer center and thereby provide uniform etching across the entire wafer surface, the flow of process gas towards the center of a wafer is reduced. This is typically accomplished by providing smaller apertures 26 at the center of the GDP. The number and size of the apertures is increased near the circumference of the GDP to increase further the flow of process gas to the wafer's edge. Optionally, a portion of the apertures may also be blocked to force the process gas to flow to the wafer from apertures at the edge of the GDP. Approximately 90–95% of the central apertures may be so blocked.

Figure 4:
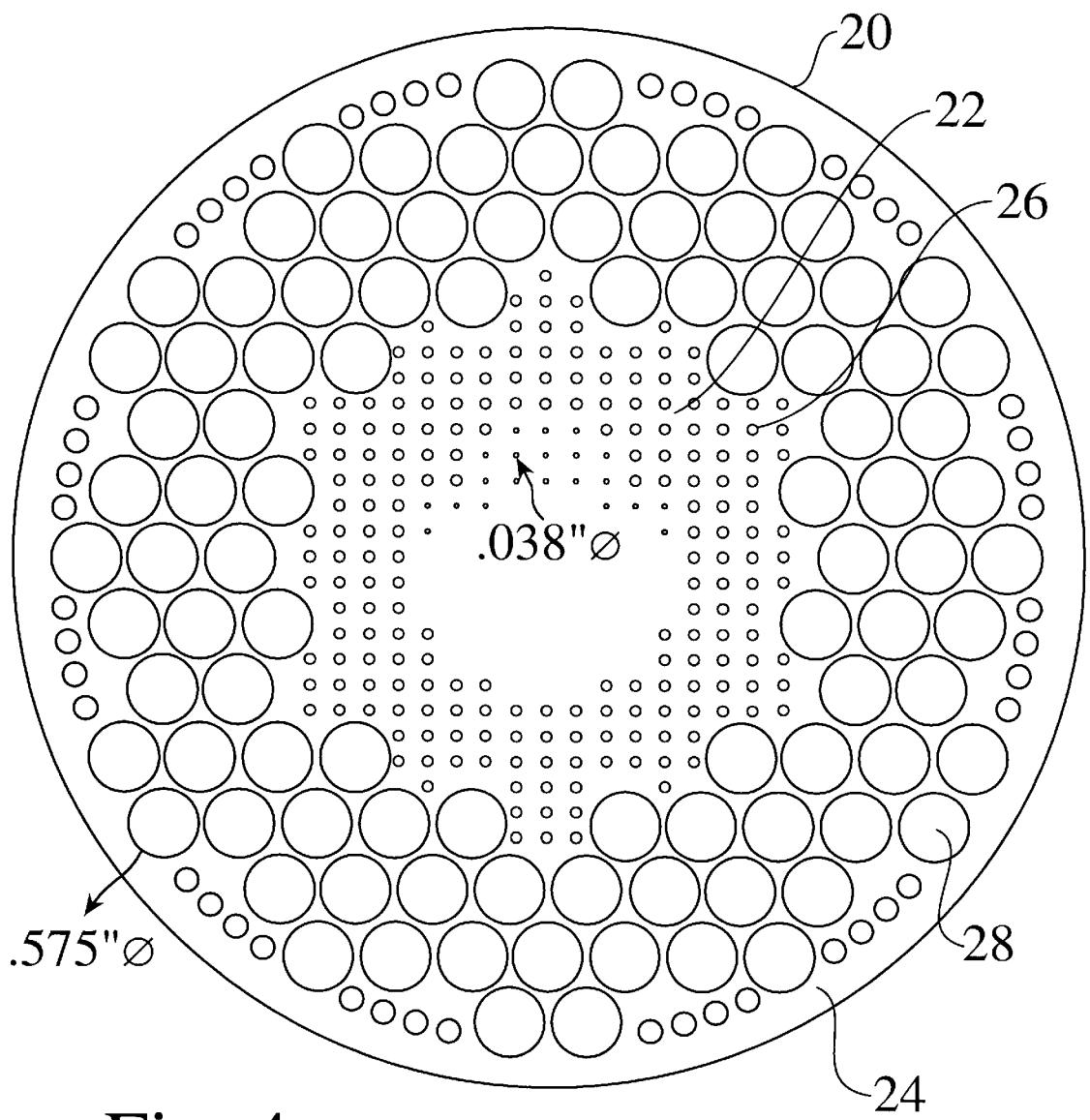
FIG. 4 is a top plan view of the gas distribution plate of FIG. 3.

FIG. 4 is a top plan view of the gas distribution plate 20, according to the invention. As shown in the figure, the GDP has a thinner central portion 22 having fewer and smaller apertures 26 formed therethrough, and a thicker circumferential portion 24 having more and larger apertures 28 formed therethrough. The actual arrangement of apertures is considered to a be matter of choice and may be arrived at independently of the section profile imparted to the GDP.

One consideration in the invention is that the mass per unit area of the GDP is constant across the plate. The GDP is therefore profiled to promote an even etch rate across the surface of the wafer, yet has a lower thermal mass than the prior art GDP's, but with sufficient mechanical rigidity and strength. In this way, the GDP quickly reaches thermal equilibrium, typically with the first wafer, thereby mitigating or entirely eliminating the first wafer effect.

The material used to fabricate the GDP is determined largely by the chemical resistance required in the process chamber. Different materials may be selected based upon the particular process used to etch the wafer. In the preferred embodiment of the invention, the GDP is formed of a fluorine-resisting, refractory material such as aluminum oxide, known as alumina, or sapphire. In alternate embodiments, the GDP is formed of other materials, including ceramics or quartz, as are appropriate for the etch or process chemistries involved.

The GDP is typically contoured by standard techniques, including machining, laser cutting, or grinding. In the preferred embodiment of the invention, both surfaces of the GDP are symmetrically contoured for ease of assembly. However, in alternate embodiments, the two sides can be asymmetrically contoured. For example, a depression may be formed in one side of the GDP to effect the desired center profile.

The presently preferred embodiment of the invention has a central thickness of about 25 to $50/1000$'s of an inch. The circumferential thickness, is about 75 to $150/1000$'s of an inch. Such thicknesses are provided as examples of the presently preferred range of thicknesses. The invention is not, however, limited to the thickness ranges recited herein.

The GDP has approximately the same or slightly larger diameter than the wafer. The GDP, therefore, is approximately eight inches in diameter for an eight-inch wafer. However, it is readily apparent to one skilled in the art that the diameter of the GDP can be increased to compensate for increased or decreased wafer diameter.

A GDP is subjected to various forces during wafer processing. In particular, the GDP is affected by gas pressure, and by its own weight. A third, and less significant, force affecting a GDP is produced by the technician's or engineer's physically holding the GDP during installation of the GDP into a process chamber. Also, during initial assembly, the chamber is at atmospheric pressure. When the chamber is evacuated, a vacuum pump rapidly reduces the chamber pressure. While most of the volume of the chamber may be below the bottom surface of the GDP, a substantial volume may be above the GDP. For a prior art GDP having a constant thickness of $100/1000$ inch across its surface, the GDP's own weight is the predominant force affecting the rigidity of the GDP. However, in the invention, where the thickness of the GDP may be reduced to approximately $25/1000$'s inch, the main force on the GDP is the differential gas pressure exerted upon the upper surface of the GDP during chamber evacuation. It is therefore important to consider GDP loading during initial chamber evacuation when selecting an optimal GDP thickness.

Figure 5A:
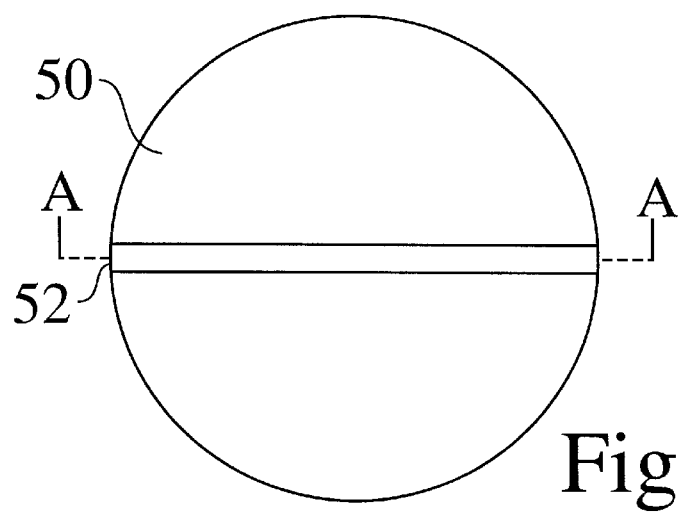
FIGS. 5a and 5b provide a plan view and a sectioned side elevational view, respectively, of a gas distribution plate according to an alternative embodiment of the invention.
Figure 5B:
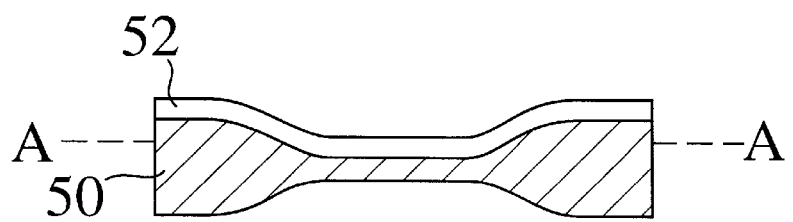

FIGS. 5a and 5b provide a plan view and a sectioned side elevational view, respectively, of a gas distribution plate according to an alternative embodiment of the invention. In this embodiment of the invention, cross-members 52 are placed across the upper or lower surface of the GDP 50 to provide sufficient mechanical rigidity and strength, and thereby compensate for the reduced thickness of the GDP, for example in the center of the GDP. The cross-members may be formed by attaching separate cross-members to the GDP or by leaving certain areas of the GDP at a greater thickness during GDP fabrication.

Although the invention is described herein with reference to the preferred embodiment, one skilled in the art will readily appreciate that other applications may be substituted for those set forth herein without departing from the spirit and scope of the present invention.

For example, in an alternate embodiment of the invention, the GDP is not profiled. In such embodiment the GDP is formed of a material that has sufficient mechanical strength, and that has low enough thermal mass, to allow the fabrication of a GDP having a uniform cross-section.

In some embodiments of the invention, an advantage of providing larger holes along the edge of the GDP is to facilitate the projection of a laser beam through the holes for endpoint detection. In the prior art, windows or other materials are commonly used to transmit the laser beam. The larger holes of the invention extend completely through the GDP to permit the transmission of the laser beam without any interference.

Finally, the GDP herein disclosed is adapted for use in a standard chamber containing a wafer chuck or other support for holding a wafer. The invention is applicable to both plasma generation within the chamber or remote plasma generation processes. However, in the preferred embodiment of the invention, the major energy source is not between the wafer and the GDP. When the major energy source is between the two, the effects of temperature variations are much reduced. If the major energy source is farther away, the influence of the GDP is very important in determining the energy transfer from the major energy source, in this case a plasma, to the wafer itself.

Accordingly, the invention should only be limited by the claims included below.

It is claimed:

1. A gas distribution apparatus for evenly distributing a reactant process gas over a surface of a wafer, comprising:

an apertured plate having top and bottom surfaces, said plate having a profiled cross-section;

wherein said plate may be rapidly heated to an equilibrium temperature determined by radiated heat transfer.

2. The gas distribution apparatus of claim 1, wherein said plate has a profiled cross-section that is about $50/1000$'s of an inch or smaller in thickness.

3. The gas distribution apparatus of claim 1, wherein said plate has a uniformly profiled cross-section.

4. The gas distribution apparatus of claim 1, wherein said plate is profiled such that a center portion of said plate is thinner than a circumferential portion of said plate.

5. The gas distribution apparatus of claim 1, wherein said apertures are smaller in diameter at a central portion of said plate than at a circumferential portion of said plate.

6. The gas distribution apparatus of claim 1, wherein said apertures at a circumferential portion of said plate are adapted to facilitate the transmission of a laser beam therethrough for endpoint detection.

7. The gas distribution apparatus of claim 1, wherein a plurality of said apertures at a central portion of said plate are blocked.

8. The gas distribution apparatus of claim 1, wherein said plate is formed of a fluorine-resisting, refractory material.

9. The gas distribution apparatus of claim 1, wherein said plate is formed of a material selected from the group consisting of aluminum oxide, sapphire, ceramic, and quartz.

10. The gas distribution apparatus of claim 4, wherein said top and bottom surfaces of said plate are symmetrically contoured to establish said cross section profile.

11. The gas distribution apparatus of claim 4, wherein said top and bottom surfaces of said plate are asymmetrically contoured to establish said cross section profile.

12. The gas distribution apparatus of claim 1, further comprising:

at least one cross-member placed across at least one of said top or said bottom surfaces of said plate.

13. The gas distribution apparatus of claim 12, wherein said cross-member is formed as a part of said plate.

14. The gas distribution apparatus of claim 12, wherein said cross-member comprises a separate member affixed to at least one of said top or said bottom surfaces of said plate.

15. A gas distribution apparatus for evenly distributing a reactant process gas over a surface of a wafer, comprising:

an apertured plate having top and bottom surfaces, said plate including a central portion with a cross-section having a reduced thickness relative to the thickness of a circumferential portion of said plate;

wherein said plate may be rapidly heated to an equilibrium temperature determined by radiated heat transfer.

16. The gas distribution apparatus of claim 15, further comprising:

at least one cross-member placed across at least one of said top or said bottom surfaces of said plate.

17. A method for evenly distributing a reactant process gas over a surface of a wafer, comprising the steps of:

providing an apertured gas distribution plate having top and bottom surfaces, said plate including a central portion having a reduced thickness relative to a circumferential portion thereof; and adjusting the diameters of said apertures to direct a passage of said process gas therethrough that provides an even distribution of said process gas to said substrate;

wherein said plate may be rapidly heated to an equilibrium temperature determined by radiated heat transfer.

18. The method for distributing process gas over a substrate of claim 17, further comprising the step of:

providing at least one cross-member placed across at least one of said top or said bottom sides of said plate.

* * * * *